United States Patent
Gong et al.

(10) Patent No.: US 10,262,911 B1
(45) Date of Patent: Apr. 16, 2019

(54) CIRCUIT FOR AND METHOD OF TESTING BOND CONNECTIONS BETWEEN A FIRST DIE AND A SECOND DIE

(71) Applicant: Xilinx, Inc., San Jose, CA (US)

(72) Inventors: Yuqing Gong, San Jose, CA (US); Henley Liu, San Jose, CA (US); Myongseob Kim, Pleasanton, CA (US); Suresh P. Parameswaran, Fremont, CA (US); Cheang-Whang Chang, Mountain View, CA (US); Boon Y. Ang, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 6 days.

(21) Appl. No.: 15/379,258

(22) Filed: Dec. 14, 2016

(51) Int. Cl.
*H01L 21/66* (2006.01)
*H01L 23/00* (2006.01)

(52) U.S. Cl.
CPC .............. *H01L 22/34* (2013.01); *H01L 22/12* (2013.01); *H01L 24/09* (2013.01)

(58) Field of Classification Search
CPC . H01L 2924/15311; H01L 2224/16225; H01L 2224/97; H01L 2225/06513; H01L 2225/06517; H01L 22/20; H01L 22/34; G01R 31/318513; G01R 1/0416; G01R 31/2812; G01R 31/2853; G01R 31/2856; G01R 31/2896
USPC .............. 324/762.03, 750.01, 750.07, 750.3, 324/751.03, 754.07, 762.06; 257/48
See application file for complete search history.

(56) References Cited

U.S. PATENT DOCUMENTS

| | | | | |
|---|---|---|---|---|
| 5,608,337 A | * | 3/1997 | Hendricks | G01R 31/316 257/E21.525 |
| 6,551,844 B1 | * | 4/2003 | Eldridge | G01R 1/07307 257/E23.021 |
| 6,831,294 B1 | * | 12/2004 | Nishimura | G01R 31/2884 257/48 |
| 7,075,175 B2 | * | 7/2006 | Kazi | G01R 31/3008 257/678 |
| 7,312,625 B1 | * | 12/2007 | Paak | G01R 31/2884 324/762.02 |
| 8,212,576 B1 | | 7/2012 | Cho et al. | |
| 8,890,562 B1 | * | 11/2014 | Hartanto | G01R 31/318513 324/762.06 |
| 9,128,148 B2 | | 9/2015 | Lowney et al. | |
| 9,341,668 B1 | | 5/2016 | Hariharan et al. | |
| 2008/0143379 A1 | * | 6/2008 | Norman | H01L 23/50 326/39 |
| 2011/0148456 A1 | * | 6/2011 | Mooyman-Beck | G01R 31/318511 324/762.02 |
| 2011/0012633 A1 | | 11/2011 | Rahman et al. | |
| 2011/0316572 A1 | | 12/2011 | Rahman | |
| 2013/0135004 A1 | * | 5/2013 | Hashimoto | G01R 31/318513 324/762.03 |

(Continued)

*Primary Examiner* — Jonathan Han
(74) *Attorney, Agent, or Firm* — John J. King (57) ABSTRACT

A circuit for testing bond connections between a first die and a second die is described. The circuit comprises a defect monitoring circuit implemented on the first die, which is configured as a test die; and a plurality of bond connections between the first die and the second die; wherein the defect monitoring circuit is configured to detect a defect in a bond connection of the plurality of bond connections between the first die and the second die. A method of testing bond connections between a first die and a second die is also described.

20 Claims, 8 Drawing Sheets

(56) References Cited

U.S. PATENT DOCUMENTS

2014/0091819 A1* 4/2014 Gong .............. G01R 31/31926
324/750.3

* cited by examiner

CIRCUIT FOR AND METHOD OF TESTING BOND CONNECTIONS BETWEEN A FIRST DIE AND A SECOND DIE

TECHNICAL FIELD

The present invention relates generally to integrated circuit devices, and in particular, to a circuit for and a method of testing bond connections between a first die and a second die.

BACKGROUND

As integrated circuit processing continues to advance, effort is made to increase the capacity and reduce the size of integrated circuits. While traditional complementary metal-oxide semiconductor (CMOS) scaling processes improve signal propagation speed, scaling from current manufacturing and chip-design technologies is becoming more difficult and costly, in part because of power-density constraints, and in part because interconnects do not become faster with faster transistors. Three-dimensional (3D) integrated circuits (ICs) address the scaling challenge by stacking 2D die and connecting them in the 3rd dimension using wafer bonding. Among other benefits, the use of 3D ICs enables speeding up communication between layered die, compared to a planar layout.

Typical process defects in the wafer bonding technology normally include an open defect and a short defect of the wafer bonding paths. Finding these defects is very challenging in current 3D IC products, especially at the development stage. It is very difficult to find the exact locations of process defects in the wafer bonding products, due to the large number of bonding paths. While an X-ray scan could be done for a large number of bonding paths, it would take a significant amount of time to find the exact location of the failure. Generally, the number of bonding paths in one daisy chain structure may be a few hundred. If the structure has failed, it would take a significant time to scan the chain, where each bonding path in the structure would have to be carefully scanned by x-ray. A chain with the small number of bonding paths can be placed, but just a few structures can be scanned because of the limited number of probe pads. Finding a root cause of failures and providing feedback to an IC fabrication group as soon as possible can be significant in the manufacture of ICs.

Accordingly, circuits and methods that enable testing bond connections between wafers having a first and second die and between a first and second die in an integrated circuit device are beneficial.

SUMMARY

A circuit for testing bond connections between a first die and a second die is disclosed. The circuit comprises a defect monitoring circuit implemented on the first die, which is configured as a test die; and a plurality of bond connections between the first die and the second die; wherein the defect monitoring circuit is configured to detect a defect in a bond connection of the plurality of bond connections between the first die and the second die.

Another circuit for testing bond connections between a first die and a second die comprises a defect monitoring circuit implemented on the first die; and a plurality of bond connections between the first die and the second die; wherein the second die comprises a PLD; and wherein the defect monitoring circuit is configured to detect a defect in a bond connection of the plurality of bond connections between the first die and the second die.

A method of testing bond connections between a first die and a second die is also described. The method comprises providing a first test signal from a defect monitoring circuit implemented on a first die to a second die by way of a first bond connection between the first die and the second die; receiving the first test signal at the defect monitoring circuit from the second die by way of a second bond connection; and determining whether there is a defect in at least one of the first bond connection and the second bond connection.

Other features will be recognized from consideration of the Detailed Description and the Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods use defect monitoring circuits, also known as defect monitoring vehicles (DMVs) to isolate defects in the wafer bonding technology. The circuit and methods treat the wafer bonding paths as individual devices under test (DUTs) and test their continuity and bridging both after wafer bonding and during the reliability burn-in stage after packaging. Typical process defects in the wafer bonding technology normally include open circuit defects and short circuit defects of the wafer bonding paths. Location these defect is very challenging in current 3D IC products, especially at development stage. More particularly, it is very difficult to find the exact locations of process defects in the wafer bonding products, due to the huge number of bonding paths. The circuits and methods described in more detail below offer continuous monitoring of the wafer-bonding process both during the process development phase and IC production phase.

A 3D programmable logic device (PLD), such as a field programmable gate array (FPGA) product, is expected to use only a percentage of total area of wafer bonding, such as 10% to 20% of the total area of wafer bonding, for the interconnects between top-die and bottom-die. Therefore, the vast majority of the area is generally filled with "floating" dummy bumps to maintain the bump density for better chemical-mechanical planarization (CMP) results. The circuits and methods set forth below utilize these dummy wafer-bonding bumps and provide real-time coverage of the wafer-bonding health monitoring throughout the production and also during the reliability span of a packaged integrated circuit. More particularly, dummy "floating" bumps are converted to wafer-bonding DUTs (Devices Under Test) and then connected to reserved logic modules such as CLBs of a PLD. Programming of the FPGA product then can be performed to achieve the testing of these individual DUTs. Defect localization can also be performed to provide fast pin-point of the wafer-bonding defects for physical failure analysis (PFA). The circuits can be fully embedded in a programmable logic device such as an FPGA device with little or no area cost. The circuits and methods can provide continuous defect monitoring both in the production and also the reliability qualification phase, and can also be incorporated into a self-test/check design for test (DFT) protocol, so it may provide users of an integrated circuit device with early warnings of potential product failure in wafer-bonding bumps.

Figure 1:
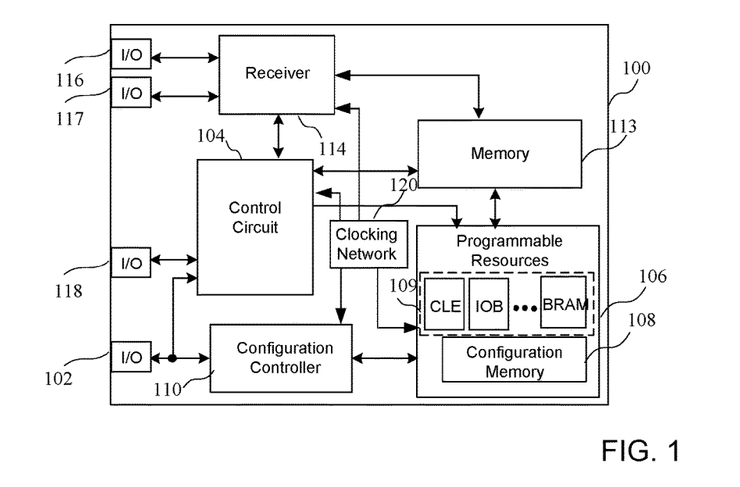
FIG. 1 is a block diagram of an integrated circuit comprising circuit elements that may be included in different die of an integrated circuit.

Turning first to FIG. 1, a block diagram of an integrated circuit comprising circuit elements that may be included in different die of an integrated circuit is shown. In particular, an input/output port 102 is coupled to a control circuit 104 that controls programmable resources 106 having elements 109 including configurable logic elements (CLEs), input/output blocks (IOBs), and blocks of random access memory (BRAM). Configuration data may be provided to the configuration memory 108 by a configuration controller 110. The configuration data enables the operation of the programmable resources 106. A memory 113 may be coupled to the control circuit 104 and the programmable resources 106. A receiver circuit 114 may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. The circuits and methods as described in more detail below could be implemented to enable a 3D IC as shown in FIG. 2, for example.

Figure 2:
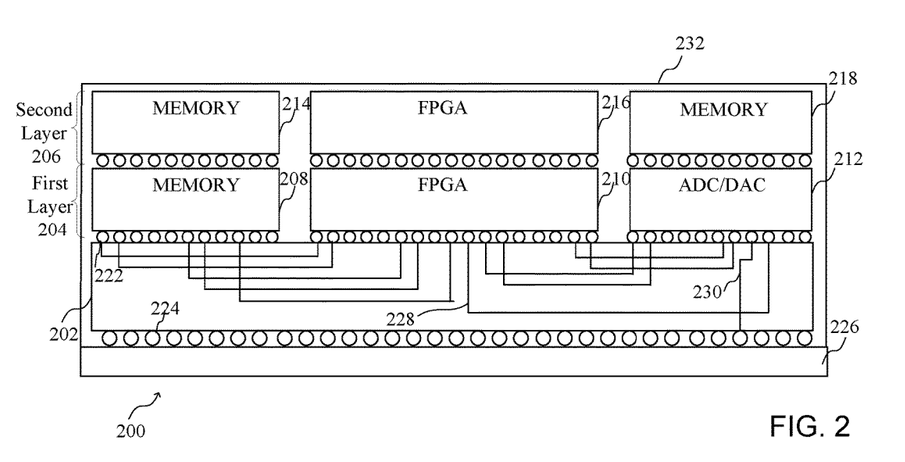
FIG. 2 is a cross-sectional view of a 3D integrated circuit package having die that are bonded together.

Turning now to FIG. 2, a cross-sectional view of an integrated circuit package 200 having die that are bonded together is shown. The integrated circuit package of FIG. 2 shows pairs of die which are bonded together, where the pairs of die are attached to an interposer of the integrated circuit package. It should be noted that the circuits and methods for testing a bond connection between a first die and a second die could be implemented with the pairs of die of FIG. 2. As will be described in more detail below, the circuits and methods can be used to test bond connections between the pairs of die while they are still a part of two separate wafers, or when they are incorporated in a packaged integrated circuit package as shown. The integrated circuit package of FIG. 2 comprises an interposer 202 coupled to receive stacked IC die, which are generally stacked in a first layer 204 and a second layer 206. The first layer 204 of IC die includes a memory die 208, a Field Programmable Gate Array (FPGA) die 210, and an analog-to-digital converter/digital-to-analog converter (ADC/DAC) die 212. The second layer 206 of IC die comprises a memory die 214, an FPGA die 216 and another memory die 218. The particular die in the IC die layers of FIG. 2 are shown by way of example, and any arrangement of these or other IC die could be implemented to enable an efficient operation of circuits implemented in the various die. Bond connections 220 are provided between the die of the first layer of IC die and die of the second layer of IC die, as will be described in more detail below in reference to FIGS. 3 and 4. Connective elements 222, such as solder bumps, are provided between die of the first layer of IC die 204 and the interposer 202. Solder bumps 224 are also provided between the interposer 202 and a substrate 226. Various conductive traces 228 enable the communication of signals between IC die as shown, while other conductive traces 230 enable the communication of signals from an IC die to the substrate through the interposer 202. A package, such as a cover 232, may be applied to encase the die and form a packaged integrated circuit.

While an FPGA is shown by way of example in FIG. 2, the die could implement any type of integrated circuit, including any type of device having programmable resources. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is an FPGA. In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell. Although an FPGA is shown in FIG. 2 by way of example, any type of PLD could be implemented.

While two layers of stacked die are shown, it should be understood that additional layers of IC die could be implemented on top of the first and second layers as shown. Further, while 3 IC die are shown in a given layer, it should be understood that a greater number or lesser number could be implemented in a layer of the die. Also, it is not necessary that an IC die in a first layer is bonded to an IC die in the second layer. While the circuit of FIG. 2 is one example of a 3D IC, it should be understood other implementations of 3D ICs and other circuits associated with the various die could be used in the 3D IC. For example, the IC package 200 of FIG. 2 could be implemented without the interposer 202 and the first layer of die could be implemented directly on the substrate 226. The defect monitoring circuits as described in more detail below could be implemented in determining defects in bond connections between any die at any time during the manufacture or use of the die or integrated circuit package containing the die. While reference is made to an IC die, it should be understood that an IC die is also commonly called an IC chip, and refers to a portion that is cut or "diced" for a wafer after an IC wafer processing operation.

Figure 3:
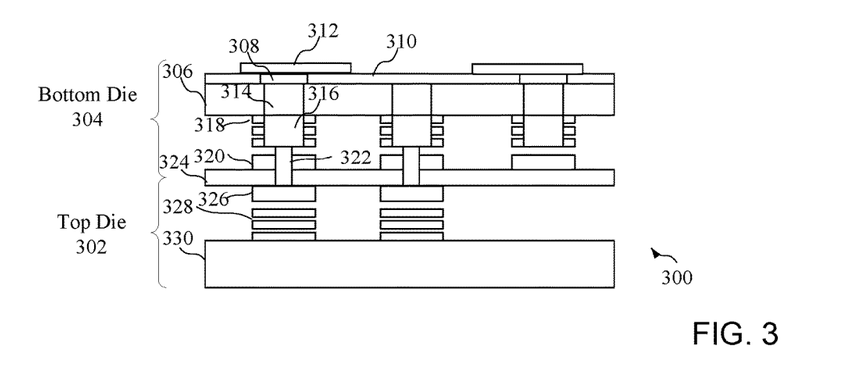
FIG. 3 is a cross-sectional view showing 2 die that are bonded together according to a first implementation.

Turning now to FIG. 3, a cross-sectional view shows two die that are bonded together according to a first implementation to form a bonded pair of die 300. FIG. 3 is an example of a type of bond connection that can be monitored for a defect by the circuits and methods set forth in more detail below. More particularly, a top die 302 is bonded to a bottom die 304 by bond connections. More particularly, the bottom die comprises a substrate 306 having a having a contact 308 extending through an insulating layer 310 to a contact element 312. It should be noted that the arrangement of die of FIG. 3 would be flipped over and attached to an interposer or a substrate as described above in reference to FIG. 2, where the contact element would be bonded to a corresponding contact pad of the interposer or substrate by way of a solder bump for example. A through-silicon-via (TSV) 314 is coupled to a via structure 316 extending through a plurality of via layers and a plurality of metal layers 318 to a top layer contact 320 formed in a contact layer. A through-oxide-via (TOV) 322 comprises a bond connection extending through an oxide layer 324 to a corresponding top layer contact 326 of the top die 302 formed in a contact layer of the top die. The top chip also comprises metal layers 328 and a substrate 330.

Figure 4:
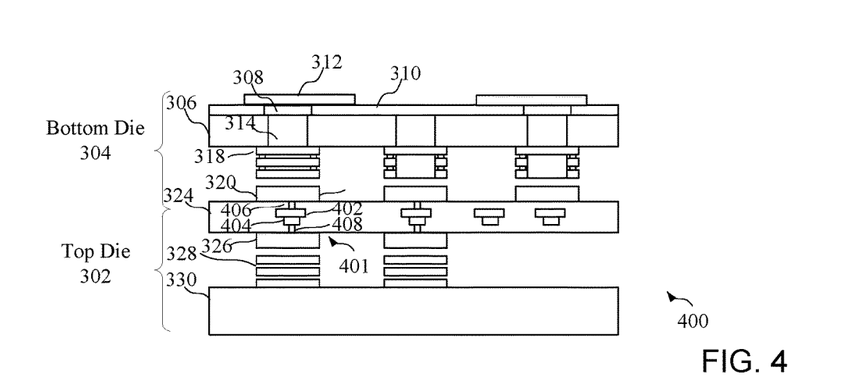
FIG. 4 is a cross-sectional view showing 2 die that are bonded together according to a second implementation.

Turning now to FIG. 4, a cross-sectional view shows two die that are bonded together according to a second implementation to form a bonded pair of die 400. FIG. 4 is another example of a type of bond connection that can be monitored for a defect by the circuits and methods set forth in more detail below. According to the implementation of FIG. 4, a hybrid bond connection 401 comprises a first metal layers 402 and a second metal layer 404, commonly known as HBL layers, which are coupled to the bottom contact 320 by way of a via 406 and to the top contact 326 by way of a via 408, also known as HBC layers. The TOVs of FIG. 3 or the hybrid bond connection of FIG. 4, along with the metal layers, and vias between the metal layers enable the routing of signals from a defect monitoring circuit through various TOVs between the die and back to the defect monitoring circuit to detect a defect in a bond connection between the die, as will be described in more detail in reference to FIG. 5.

Figure 5:
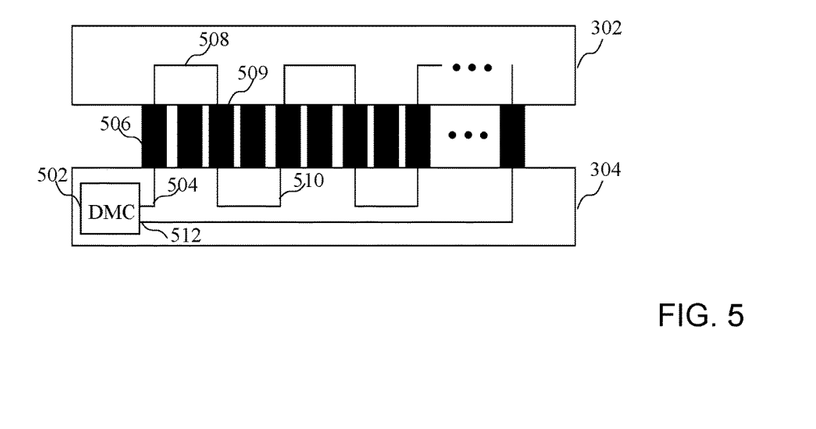
FIG. 5 is a block diagram showing a plurality of connections forming a chain between two die.

Turning now to FIG. 5, a block diagram shows a plurality of connections forming a chain between two die and a defect monitoring circuit. The block diagram of FIG. 5 provides an arrangement of elements associated with two die that enable testing bond connections between the two die. More particularly, the top die 302 is bonded to a bottom die 304 by way of a plurality of bond connections. A defect monitoring circuit 502 having an output 504 is coupled to a first bond connection 506. A conductive element 508, which may comprise metal traces in metal layers of the top die 302, enable the connection from the first bond connection 506 to a second bond connection 509. A conductive element 510 in the bottom die 304 enables a connection to the second bond connection 509. As is apparent from FIG. 5, a signal generated at the output 504 of the defect monitoring circuit 502 is routed through a chain of bond connections and conductive elements extending in and out of the first and second die, where an output signal is coupled to an input 512 of the defect monitoring circuit 502. While one defect monitoring circuit 502 is shown, it should be understood that many defect monitoring circuits could be implemented in each of the die. Further, the defect monitoring circuits could support scan chains in both a horizontal direction and a vertical direction as described in more detail in reference to FIG. 6, or in any path. The routing of signals enables determining whether there is a defect in a bond connection between the die, as will be described in more detail in reference to FIGS. 8 and 9.

Figure 6:
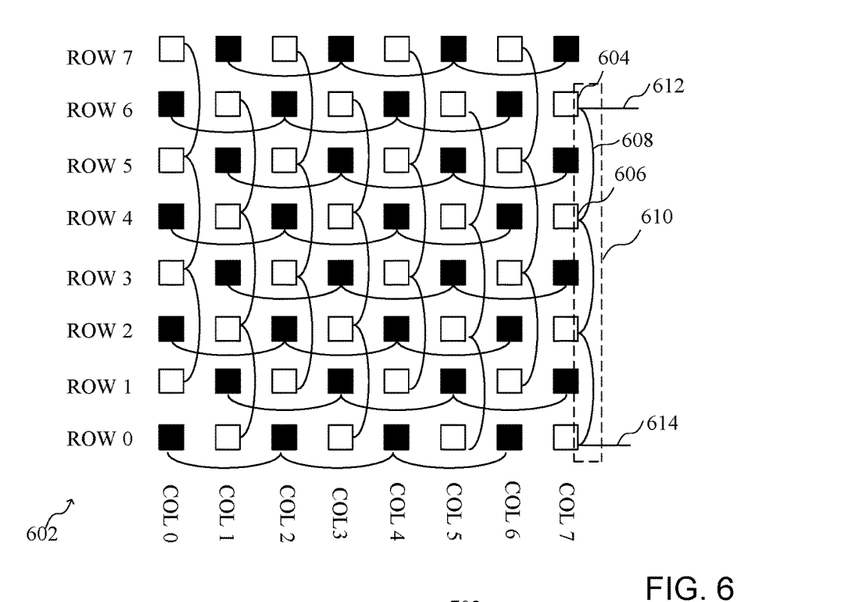
FIG. 6 is a diagram showing an arrangement of contact elements associated with bond pads of a die to enable identifying a location of a defect in a bond connection between two die.

Turning now to FIG. 6, a diagram shows an arrangement of contact elements associated with bond connections between the two die to enable identifying a location of a defect in a bond connection. The arrangement of FIG. 6 comprises various contact elements, where contact elements in a row or column are connected to form a chain to enable detecting a defect in a bond pad. According to the arrangement of FIG. 6, alternating contact elements in rows (shown in shadow) are connected, and alternating contact elements in columns (shown in white) are connected. By way of example, a first bond pad 604 in row 6 is coupled to a second bond pad 606 of row 4 by way of a contact element 608. The contact elements 608 correspond to conductive elements associated with both of the die, such as conductive elements 508 associated with the top die 302 and conductive elements 510 associated with the bottom die 304. Multiple contact elements 608 form a chain 610 having an input 612 and an output 614. As will be described in more detail below, test data can be applied at the input 612 and detected at the output 614 to determine whether there are any defects in any of the bond connections in the chain 610. The use of contact elements coupled to alternate bond pads enables the generation of contact chains between two die, as described above in reference to FIG. 5. A 2D-array of bonding paths is formed, which may consist of tens of thousands of daisy chains, in which millions of bonding paths are connected in both row and column directions. The circuits and methods include a decoder for detecting signals generated at outputs of the defect monitoring circuits, and therefore eliminate the need of massive number of probe pads, C4 bumps and/or BGA balls that are normally implemented with these daisy chains. While an 8×8 array of contact elements is shown, it should be understood that other array sizes could be implemented to provide a higher or lower resolution of the area in which a defect in a bond connection may occur. The existence of a short circuit can be determined because it will be at an intersection of a row and a column, and therefore the short could be associated with the bond connection at the intersection and one of the adjacent bond connections to the bond connections at the intersection of the row and column. Therefore, for an 8×8 matrix of bond connections as shown in FIG. 6, the short defect can be identified within one of four bond connections. The existence of an open circuit can be identified in any row or column, and therefore could be identified as being within one of eight bond connections within the row or column. Because a short circuit can be detected at an intersection of a row and a column, signals are transmitted for each of the pairs of rows and columns to detect a short circuit. Once a short circuit defect is determined to be associated with the intersection of a given row or column, the short circuit defect would be determined to be between the contact element at the intersection of the row and the column, and any adjacent contact element in an adjacent row or adjacent column. In order to identify a short circuit in any row or column, signals would be sequentially transmitted through each row and each column.

Figure 7:
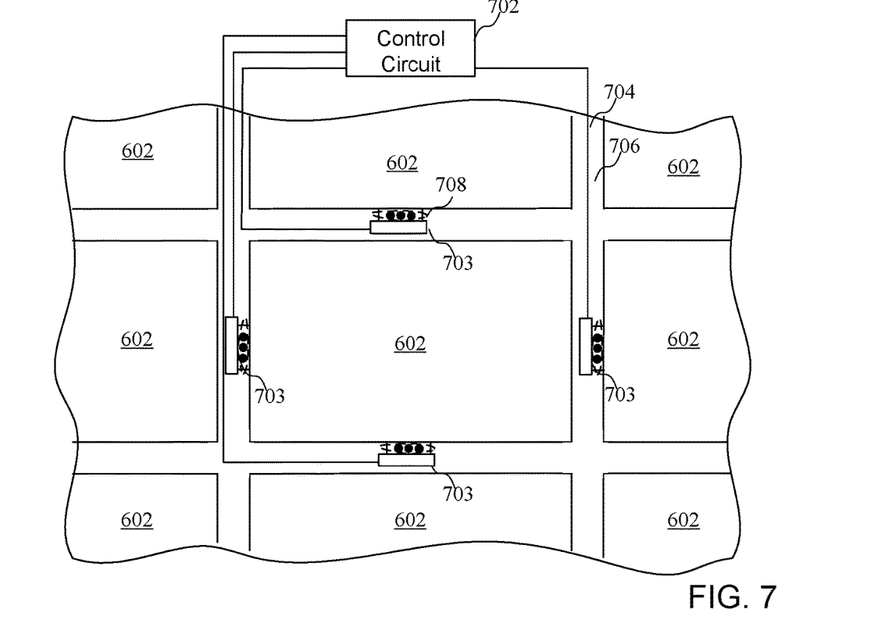
FIG. 7 is a block diagram showing a plurality of bond connection arrays and corresponding defect monitoring circuits.

Turning now to FIG. 7, a block diagram shows a plurality of contact element arrays and corresponding defect monitoring circuits. The array of contact elements of FIG. 6 can be implemented throughout a die, where corresponding defect monitoring circuits can be implemented with the contact element arrays. More particularly, the defect monitoring circuit 502 may comprise a control circuit 702 coupled to various test circuits 703 by way of signal lines 704 in signal regions 706 between the arrays 602 of bond connections. Each test circuit 703 provides signals, in response to the control circuit 702, to the array 602 by way of the I/O signal lines which may include input 612 and output 614 for each of the chains 610 associated with the eight rows and eight columns of FIG. 6. The output signals from the array provided to the test circuit 703 by way of signal lines 708 are provided to the control circuit 702, which determines whether there is a defect in a bond connection connected to the array of contact elements. The test circuits 703 can be distributed on each of the die on the wafer as necessary to determine the location of defects on the die and detects associated with portions of a wafer and may comprises an embedded decoder and an on-chip sense amp. Alternatively, the embedded decoder and the on-chip sense amp may be associated with the control circuit 702. The number of test circuits implemented on a given die could depend upon whether the die is a test die, in which case the test circuits could be implemented to cover all or substantially all of the bond connections, or distributed among unused bond connections of a die to be included in an integrated circuit as a functioning die. The control circuit 702 selectively routes signals to each of the arrays 602 to determine if there is a defect in a given array, and more particularly, the relative location of the defect within the array. That is, signals will be routed through each chain of contact elements associated with each row and each column of contact elements as shown in FIG. 6, where defects identified in a given row or column can be used to determine the location of an open circuit defect or a short circuit defect, as will be described in more detail below.

Figure 8:
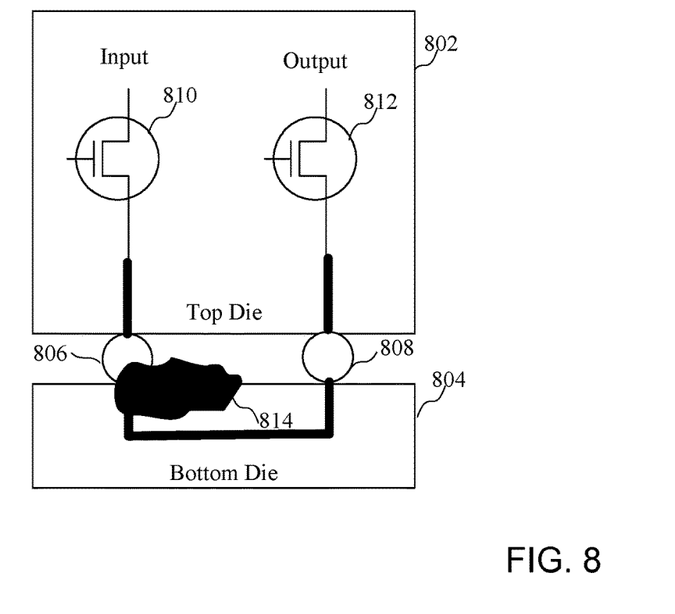
FIG. 8 is a diagram showing a circuit for determining an open circuit defect associated with a bond connection between two die.
Figure 9:
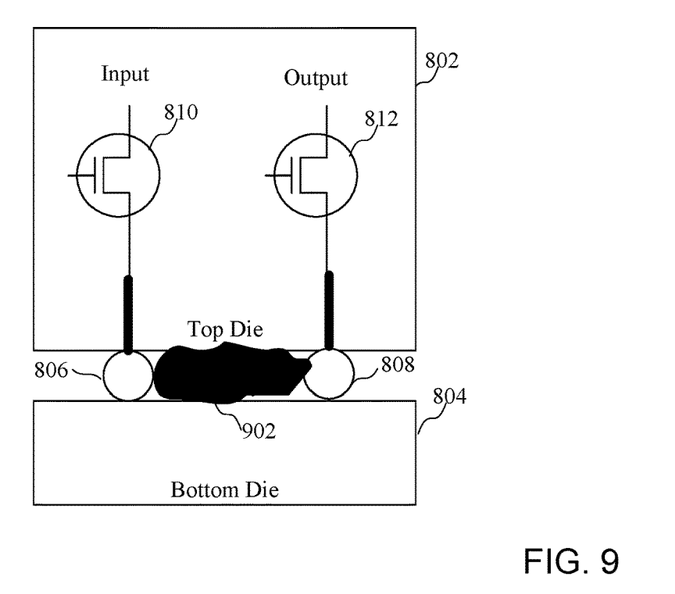
FIG. 9 is a diagram showing a circuit for determining a bridging defect associated with a bond connection between two die.

Turning now to FIG. 8, a diagram shows an open circuit defect associated with a bond connection between two die which can be detected based upon signals applied to inputs and detected at outputs of the test circuits, as described above in reference to FIG. 6. As shown in FIG. 8, a top die 802 is coupled to a bottom die 804 by way of bond connections 806 and 808 to enable the routing of test signals from the top die to the bottom die by way of the bond connections. A first switch 810, shown here as a transistor, enables routing input signals to the bottom die by way of a bond connection 806. A second switch 812 enables the routing of an output signal generated by way of the second bond connection 808. If there is an open defect 814, the input signal will not reach the output, and a defect will be detected in the row or column. As shown in FIG. 9, a bridging defect 902 may be associated with a bond connection between two die, which will result in the output to being erroneously the same as the input. While the use of switches coupled to the bond connections 806 and 808 are shown by way of example to enable path of testing bond connections, it should be understood that the circuits of FIGS. 8 and 9 are shown by way of example, and other arrangements for enabling the routing of signals through bond connections could be implemented.

Figure 10:
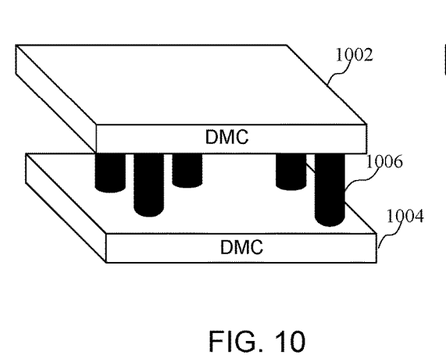
FIG. 10 is a block diagram showing die including a first die having defect monitoring circuits and a second die having defect monitoring circuits.
Figure 11:
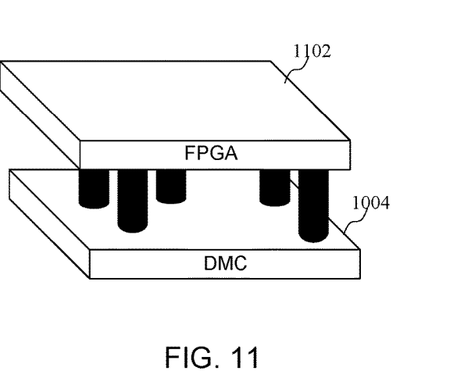
FIG. 11 is a block diagram showing die including a first die having defect monitoring circuits and a second die having an FPGA.
Figure 12:
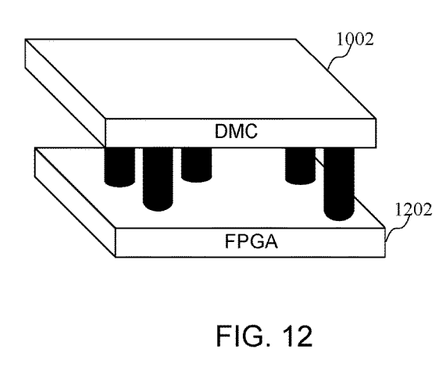
FIG. 12 is a block diagram showing die including a first die having an FPGA and a second die having defect monitoring circuits.
Figure 13:
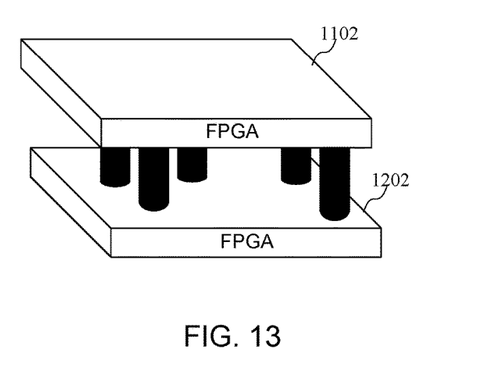
FIG. 13 is a block diagram showing die including a first die having an FPGA and a second die having an FPGA.

Turning now to FIGS. 10-13, block diagrams show die including at least one of a first die and a second die having defect monitoring circuits. FIG. 10 shows both die having defect monitoring circuits 1002 and 1004 coupled by bond connection 1006, while FIG. 13 shows both die having FPGAs 1102 and 1202. FIGS. 11 and 12 each have one defect monitoring circuit 1004 and one FPGA 1102. During the process development stage which is prior to FPGA production, the circuits and methods use defect monitoring circuits to isolate defects in the wafer bonding technology. Wafer bonding paths are treated as individual device under test (DUT), and test their continuity and bridging both after wafer bonding and during the reliability burn-in stage.

This invention has the potential application in the different development stages of 3D integrated circuits, such as 3D FPGAs through different configurations of top-die/bottom-die designs. At the initial stage of process development, a DMV-DMV configuration could be used to identify wafer-bonding defects which could impact the yield of IC devices. Later, a DMV-FPGA or FPGA-DMV configurations could be used to verify the design of FPGA top-die/bottom-die while continuing monitoring the wafer-bonding process. In the final stage, a FPGA-FPGA configuration will be used to produce full 3D ICs.

Figure 14:
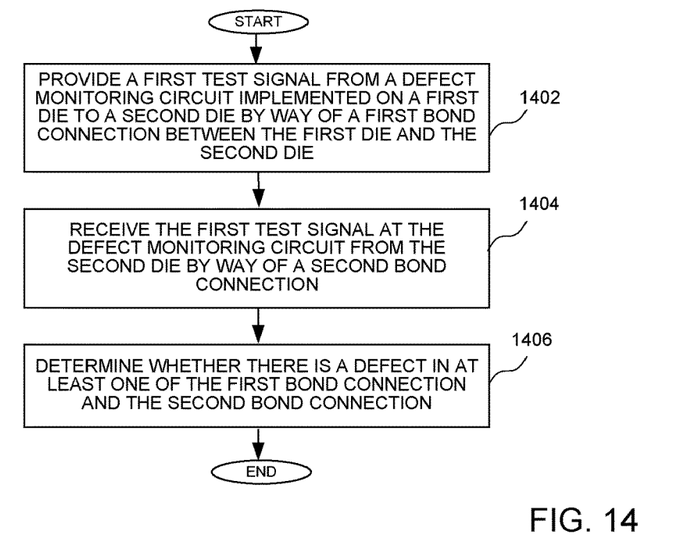
FIG. 14 is a flow chart showing a method of testing bond connections between a first die and a second die.
Figure 15:
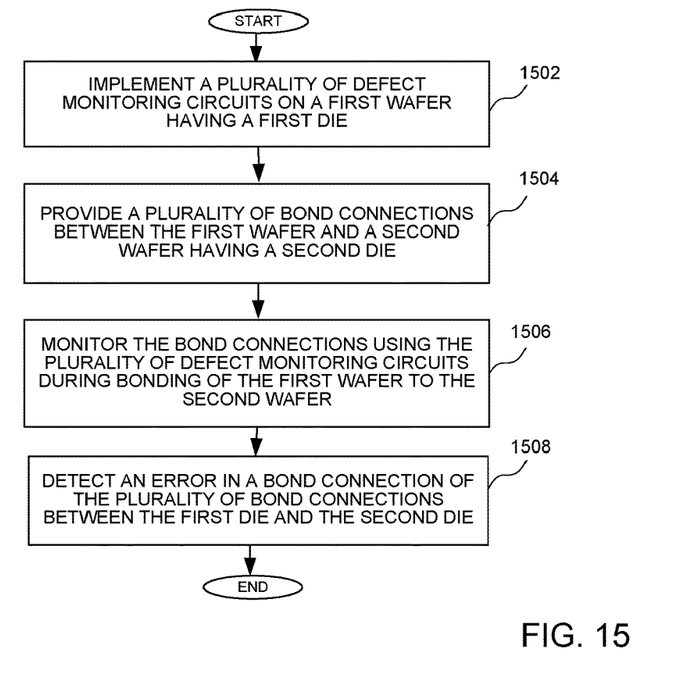
FIG. 15 is a flow chart showing a method of testing bond connections between a first wafer and a second wafer.
Figure 16:
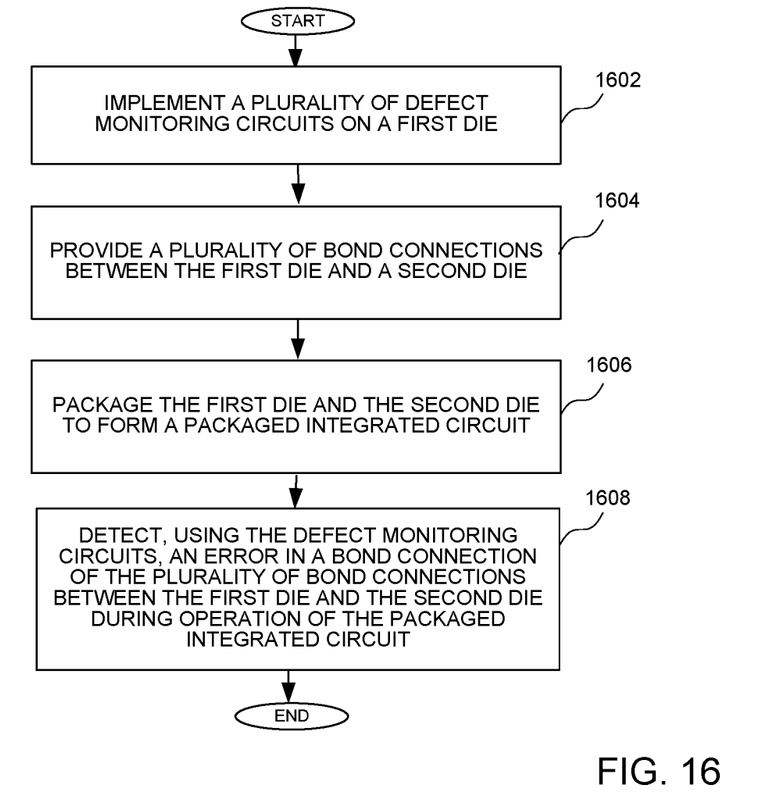
FIG. 16 is a flow chart showing a method of testing bond connections between a first die and a second die of a packaged integrated circuit.

Turning now to FIGS. 14-16, flow charts show methods of testing bond connections between die. A flow chart of FIG. 14 shows a method of testing bond connections between a first die and a second die. A first test signal is provided from a defect monitoring circuit implemented on a first die to a second die by way of a first bond connection between the first die and the second die at a block 1402. The first test signal is received at the defect monitoring circuit from the second die by way of a second bond connection at a block 1404. It the then determining whether there is a defect in at least one of the first bond connections and the second bond connection at a block 1406. The die could be tested as described above in reference to FIGS. 5-9. Both die on two wafers that are bonded together or two die of a packaged IC that are bonded together could be tested.

Turning now to FIG. 15, a flow chart shows a method of testing bond connections between a first wafer and a second wafer. A plurality of defect monitoring circuits is implemented on a first wafer having a first die at a block 1502. A plurality of bond connections is provided between the first wafer and a second wafer having a second die at a block 1504. The plurality of defect monitoring circuits enables monitoring the bond connections during bonding of the first wafer to the second wafer at a block 1506. An defect in a bond connection of the plurality of bond connections detect between the first die and the second die at a block 1308. By testing bond connections during a wafer processing phase (i.e. before the die are diced and packaged in an integrated circuit), it is possible to improve the wafer bonding process and reduce wasted product.

Turning now to FIG. 16, a flow chart shows a method of testing bond connections between a first die and a second die of a packaged integrated circuit. A plurality of defect monitoring circuits are implemented on a first die at a block 1602. A plurality of bond connections is provided between the first die and a second die at a block 1604. A package is configured to receive the first die and the second die to form a packaged integrated circuit at a block 1606. The plurality of defect monitoring circuits is configured to detect an defect in a bond connection of the plurality of bond connections between the first die and the second die during operation of the packaged integrated circuit at a block 1408. By enabling testing of the packaged IC, potentially defective bond connections can be identified, and therefore reducing the chance that a defective product will be released to a customer. Also, by enabling continuous monitoring of bond connections of a packaged ID device, a user of the IC device can be alerted to potential failure in advance, and enable reconfiguration or replacement of the potentially defective IC device.

Various other elements of the methods can be performed, as described in more detail in reference to FIGS. 1-13. For example, the first bond connection and the second bond connection may be formed during a wafer bonding process, where determining whether there is a defect in at least one of the first bond connections and the second bond connection comprises determining whether there is a defect during the wafer bonding process. The methods may further comprise dicing the wafers to form bonded pairs of die, and packaging the first die and the second die as an integrated circuit package after the wafer bonding process. Determining whether there is a defect in at least one of the first bond connections and the second bond connection may be performed after packaging the first die and the second die as an integrated circuit package, and the integrated circuit package may be continuously monitored to determine whether there is a defect in at least one of the first bond connections and the second bond connection.

Figure 17:
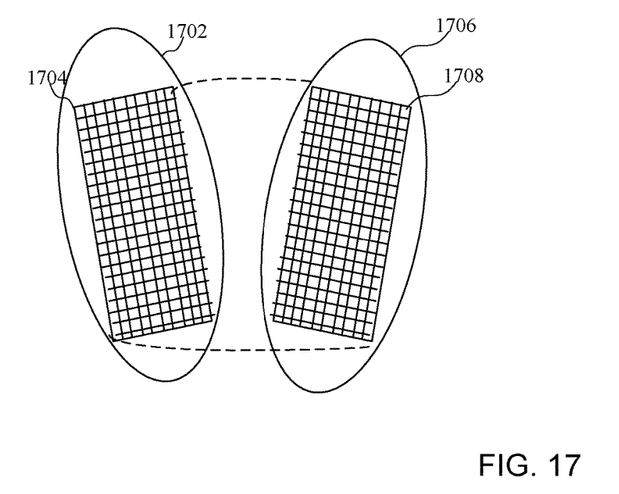
FIG. 17 is a diagram showing two wafers which may be bonded together.

Turning now to FIG. 17, a diagram shows two wafers which may be bonded together. In particular, a first wafer 1702 having a plurality of die 1704 is coupled to a second wafer 1706 having a plurality of die 1708. Corresponding die of the first and second wafer are bonded during a wafer bonding process, and the wafers are diced to form the bonded die that are packaged as an integrated circuit package. The resulting bonded die after dicing can be implemented in a packaged integrated circuit, where the bonded die could be implemented as a pair of die in the first layer and the second layer as shown in FIG. 2

Figure 18:
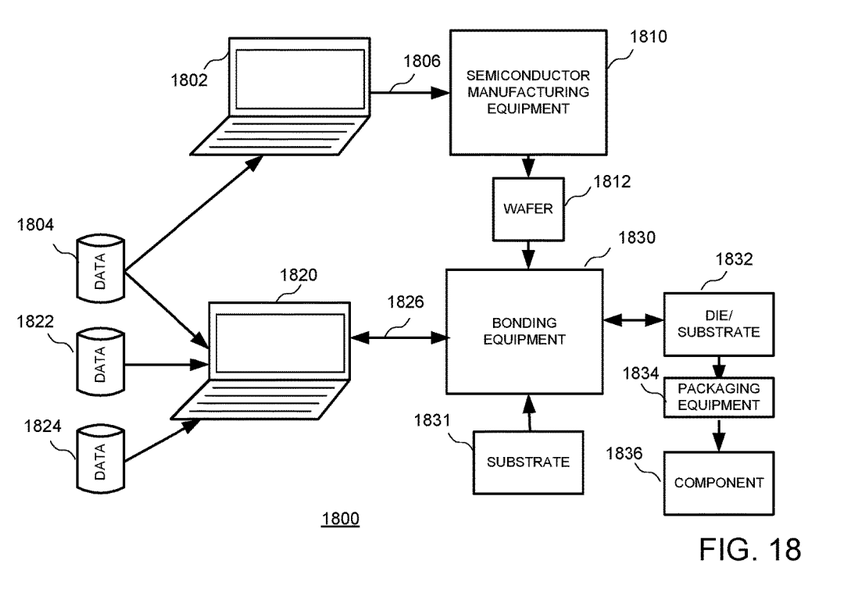
FIG. 18 is a block diagram of a system enabling the bonding of two wafers.

Turning now to FIG. 18, a block diagram of a system enabling the bonding of two wafer is shown. The system 1800 comprises computer-aided design (CAD) equipment 1802, which could be any computer adapted to run CAD software. The CAD equipment 1802 receives data, such as a master pinlist 1804, and is coupled by a communication link 1806 to semiconductor manufacturing equipment 1810. The semiconductor manufacturing equipment 1810 generates a wafer 1812 having a plurality of die, as is well known in the art.

CAD equipment 1820, which is also coupled to receive the master pinlist 1804, receives a bonding diagram 1822 and substrate artwork 1824. The CAD equipment 1820 is coupled by a communication link 1826 to bonding equipment 1830. The communication links 1806 and 1826 could be any wired or wireless communication link. The bonding equipment generally provides wire bonds from a die from the wafer 1812 to a substrate 1831 receiving the die, as will be described in more detail in reference to other figures. The die/substrate 1832 is coupled to packaging equipment 1834 which generates a finished component 1836, such as an integrated circuit package. The system of FIG. 18 enables the manufacture of a 3D integrated circuit package according to the various circuits and methods set forth above. Although the system of FIG. 18 provides various elements required for producing an integrated circuit package, it should be understood the elements shown in FIG. 18 could be combined, or additional elements could be provided.

It can therefore be appreciated that circuits for and methods of testing bond connections between a first die and a second die have been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit for testing bond connections between a first die and a second die, the circuit comprising:
   a defect monitoring circuit implemented on the first die; and
   a plurality of bond connections between the first die and the second die;
   wherein the defect monitoring circuit comprises a plurality of test circuits and is configured to detect a defect in a bond connection of the plurality of bond connections between the first die and the second die;
   wherein the plurality of test circuits is distributed among the plurality of bond connections between the first die and the second die, each test circuit of the plurality of test circuits having an output and an input; and
   wherein each test circuit is configured to route a test signal generated at the output through a chain of bond connections of the plurality of bond connections and conductive elements associated with the first die and second die and to detect the test signal at the input.

2. The circuit of claim 1 wherein at least one of the first die and the second die comprises a programmable logic device.

3. The circuit of claim 1 wherein the first die is configured as a test die during wafer bond testing.

4. The circuit of claim 1 wherein the defect monitoring circuit enables monitoring during bonding of a first wafer having the first die to the second wafer having the second die.

5. The circuit of claim 1 wherein the defect monitoring circuit comprises a control circuit configured to receive data from the plurality of test circuits, wherein each test circuit tests a plurality of rows and a plurality of columns of the plurality of bond connections to determine a location of an open circuit defect in a row or a column or a short circuit defect at an intersection of a row and a column.

6. The circuit of claim 5 wherein each test circuit is associated with an array of bond connections.

7. A circuit for testing bond connections between a first die and a second die, the circuit comprising:
   a defect monitoring circuit implemented on the first die; and
   a plurality of bond connections between the first die and the second die;
   wherein the second die comprises a programmable logic device;
   wherein the defect monitoring circuit comprises a plurality of test circuits and is configured to detect a defect in a bond connection of the plurality of bond connections between the first die and the second die;
   wherein the plurality of test circuits is distributed among unused bond connections of the plurality of bond connections between the first die and the programmable logic device of the second die, each test circuit of the plurality of test circuits having an output and an input; and
   wherein each test circuit is configured to route a test signal generated at the output through a chain of bond connections of the plurality of bond connections and conductive elements associated with the first die and second die and to detect the test signal at the input.

8. The circuit of claim 7 wherein the first die comprises a first substrate and a first plurality of metal layers extending to a first contact layer and the second die comprises a second substrate and a second plurality of metal layers extending to a second contact layer.

9. The circuit of claim 7 further comprising a package configured to receive the first die and the second die to form a packaged integrated circuit.

10. The circuit of claim 7 wherein the defect monitoring circuit comprises a control circuit configured to receive data from the plurality of test circuits.

11. The circuit of claim 10 wherein each test circuit is associated with an array of bond connections.

12. The circuit of claim 10 wherein each test circuit tests a plurality of rows and a plurality of columns of the plurality of bond connections to determine a location of an open circuit defect in a row or a column or a short circuit defect at an intersection of a row and a column.

13. A method of testing bond connections between a first die and a second die, the method comprising:
   providing a defect monitoring circuit comprising a plurality of test circuits implemented on a first die, which is configured to communicate with a second die by way of a first bond connection of a plurality of bond connections between the first die and the second die, wherein the plurality of test circuits is distributed among the plurality of bond connections between the first die and the second die, each test circuit of the plurality of test circuits having an output and an input;
   configuring each test circuit to route a test signal generated at the output through a chain of bond connections of the plurality of bond connections and conductive elements associated with the first die and second die;
   receiving, for each test circuit, the test signal at the input from the second die by way of a second bond connection; and
   determining whether there is a defect in at least one of the first bond connection and the second bond connection.

14. The method of claim 13 further comprising forming the first bond connection and the second bond connection during a wafer bonding process, wherein the first die is configured as a test die during wafer bond testing.

15. The method of claim 14 wherein determining whether there is a defect in at least one of the first bond connection and the second bond connection comprises determining whether there is a defect during the wafer bonding process.

16. The method of claim 14 wherein each test circuit tests a plurality of rows and a plurality of columns of the plurality of bond connections to determine a location of an open circuit defect in a row or a column or a short circuit defect at an intersection of a row and a column.

17. The method of claim 14 further comprising packaging the first die and the second die as an integrated circuit package after the wafer bonding process.

18. The method of claim 17 further comprising determining whether there is a defect in at least one of the first bond connection and the second bond connection after packaging the first die and the second die as an integrated circuit package.

19. The method of claim 18 further comprising continuously monitoring the integrated circuit package to determine whether there is a defect in at least one of the first bond connection and the second bond connection.

20. The circuit of claim 7 wherein the first die is configured as a test die during wafer bond testing.

* * * * *